United States Patent
Kim

[11] Patent Number: 6,094,490
[45] Date of Patent: Jul. 25, 2000

[54] NOISE GATE APPARATUS FOR DIGITAL AUDIO PROCESSOR

[75] Inventor: Moon Ki Kim, Seoul, Rep. of Korea

[73] Assignee: LG Semicon Co., Ltd., Cheongju, Rep. of Korea

[21] Appl. No.: 08/978,474

[22] Filed: Nov. 25, 1997

[30] Foreign Application Priority Data

Nov. 27, 1996 [KR] Rep. of Korea ............ 96-58085

[51] Int. Cl.[7] ............... H04B 15/00; H03G 3/00
[52] U.S. Cl. ............... 381/94.5; 381/94.1; 381/104; 381/107
[58] Field of Search ................ 381/94.5, 71.8, 381/71.1, 71.2, 71.3, 71.4, 71.5, 71.6, 71.7, 106, 107

[56] References Cited

U.S. PATENT DOCUMENTS

| | | | |
|---|---|---|---|
| 4,953,216 | 8/1990 | Beer | 381/68.4 |
| 5,323,457 | 6/1994 | Ehara et al. | 379/388 |
| 5,334,947 | 8/1994 | Werrbach | 330/149 |
| 5,440,643 | 8/1995 | Wilson et al. | 381/119 |
| 5,664,022 | 9/1997 | Fiori, Jr. | 381/94.1 |

*Primary Examiner*—Forester W. Isen
*Assistant Examiner*—Brian Tyrone Pendleton
*Attorney, Agent, or Firm*—Fleshner & Kim, LLP

[57] ABSTRACT

A digital audio processor includes an input unit for converting an externally applied signal to a digital audio processor preferred type and a gain controller for multiplying a data converted in the input unit to control an input data size. A signal processor processes a signal outputted from the gain controller and a volume controller multiplies an output signal of the signal processor to control an output volume size. A first comparator compares a present signal and a previous signal respectively output from the input unit and a second comparator compares a present signal and a previous signal respectively output from the gain controller. A noise gate decreases a volume to a certain level when a present data is smaller than a previous data based on output values of the first and second comparators. An output unit converts an output value of the noise gate to an external output data type. The apparatus eliminates noise occurrence when a data size for an internal process becomes too small.

18 Claims, 2 Drawing Sheets

NOISE GATE APPARATUS FOR DIGITAL AUDIO PROCESSOR

BACKGROUND OF THE INVENTION

1. Field of the Invention

The present invention relates to an audio signal processor, and more particularly, to a noise gate apparatus for an digital audio processor.

2. Background of the Related Art

As shown in FIG. 1, a related art digital audio processor includes an input unit 1, a gain control unit 2, a signal processor 3, a volume controller 4 and an output unit 5. The input unit 1 converts the type of data being input depending upon whether, for example, an internal data is operated based on 16 bits or on 32 bits. The gain controller 2 multiplies a first predetermined value to the converted data to control the size of an input data and prevent the input data from overflowing. The signal processor 3 processes an output signal from the gain control unit 2. The volume controller 4 multiplies a signal processed in the signal processor 3 by second predetermined value to control the size (e.g., volume) of an output signal, and the output unit 5 converts then outputs data appropriate to an external output data type.

As shown in FIG. 2, the signal processor 3 includes a buffer 31 for storing the output signal of the gain control unit 2 and an operator 32 for operating data stored in the buffer 31. The signal processor 3 further includes an operation coefficient unit 33 for determining an operation coefficient to be operated in the operator 32 and a controller 34 for controlling the buffer 31, the operator 32 and the operation coefficient unit 33.

The operation of the related an digital audio processor will now be described. In the input unit 1, an externally applied format data is converted to data that can be processed in an internal audio apparatus. For example, external data of a serial format can be converted to a parallel format data using an external synchronous signal. Accordingly, the data can be expanded and the resultant value is adjusted to a bit and width of data used in the internal audio apparatus.

The data converted in the input unit 1 is amplified by a first predetermined amount in the gain control unit 2 and applied to the signal processor 3. The data applied to the signal processor 3 is buffered in the buffer 31 and operated in the operator 32. The operated signal is then amplified by a second predetermined amount in the volume controller 4. The output signal from the volume controller 4 is converted to a prescribed type of external output data by the output unit 5 and then outputted.

However, the related art digital audio processor has various disadvantages. For example, when the values outputted respectively from the gain control unit 2 and the volume controller 4 are too small, a frequency component different from the input signal is output as shown in FIG. 3B compared to the input signal shown in FIG. 3A, thereby generating noise.

SUMMARY OF THE INVENTION

An object of the present invention is to obviate at least the above-described problems and disadvantages of the related art.

Another object of the present invention to remove noise in an audio processor.

A further object of the present invention is to prevent an occurrence of noise when a signal less than a prescribed level is outputted for processing by a volume control, a digital filter, a reverberation and the like.

To achieve at least the above-described objects in whole or in part, a noise data apparatus for a digital audio processor according to the present invention includes an input unit for converting an externally applied signal to a type with which a digital audio processor carries out an operation, a gain controller for multiplying a data converted in the input unit by a certain value and controlling a size of input data, a signal processor for processing a signal outputted from the gain controller, a volume controller for multiplying an output signal of the signal processor by a certain value and controlling a size of an output volume, a first comparator for comparing a present signal and a previous signal respectively outputted from the input unit, a second comparator for comparing a present signal and a previous signal respectively outputted from the gain controller, a noise gate for decreasing a volume to a prescribed level when a present data is smaller than a previous data based on output values of the first and second comparators, and an output unit for converting an output value of the noise gate to a data type of an external output.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
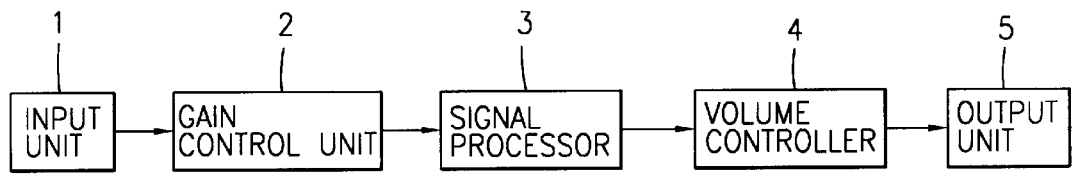
FIG. 1 is a schematic block diagram showing a related art digital audio processor.
Figure 2:
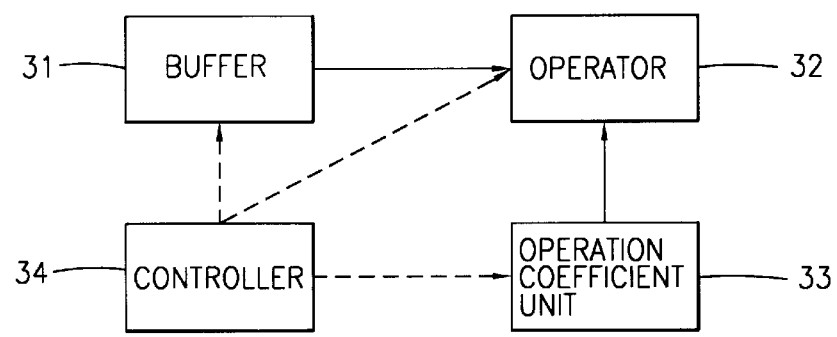
FIG. 2 is a block diagram showing a signal processor in FIG. 1.
Figure 3A:
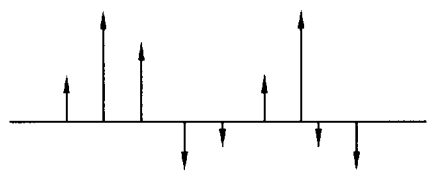
FIGS. 3A–3B one diagrams showing waveforms of an input signal and output signal in FIG. 1.
Figure 3B:
Figure 4:
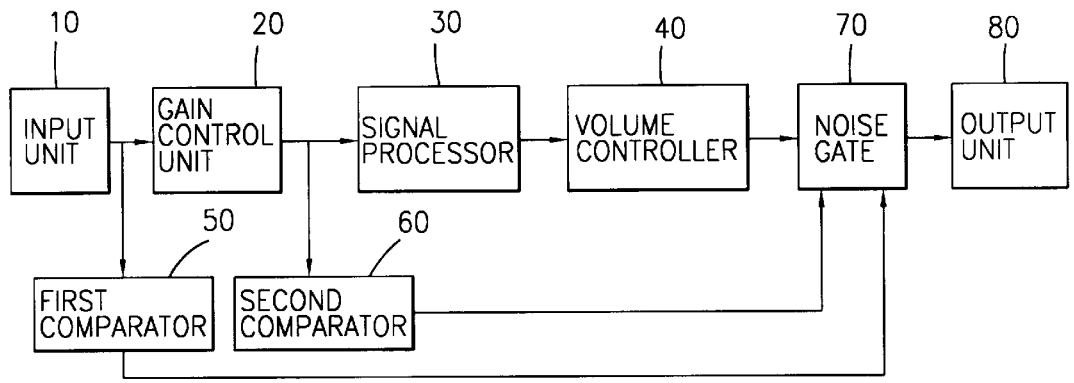
FIG. 4 is a schematic block diagram showing a preferred embodiment of digital audio processor according to the present invention.

With reference to FIG. 4, a noise gate apparatus for a digital audio processor according to a preferred embodiment of the present invention includes an input unit 10, a gain control unit 20, a signal processor 30, a volume controller 40, a first comparator 50, a second comparator 60, a noise gate 70 and a data output unit 80. The input unit 10, the gain control unit 20, the signal processor 30, the volume controller 40 and the output unit 80 are similar to the related art digital audio processor. Thus, a detailed description is omitted.

The first comparator 50 and the second comparator 60, each compare a present signal and a previous signal received as inputs. The noise gate 70 decreases a volume to a prescribed value when the present data is smaller than the previous data, which results in an output value "1" of the first and second comparators 50, 60. The first and second comparators 50 and 60 and the noise gate form the noise gate apparatus. The data output unit 80 outputs data received from the noise gate 70.

Figure 5:
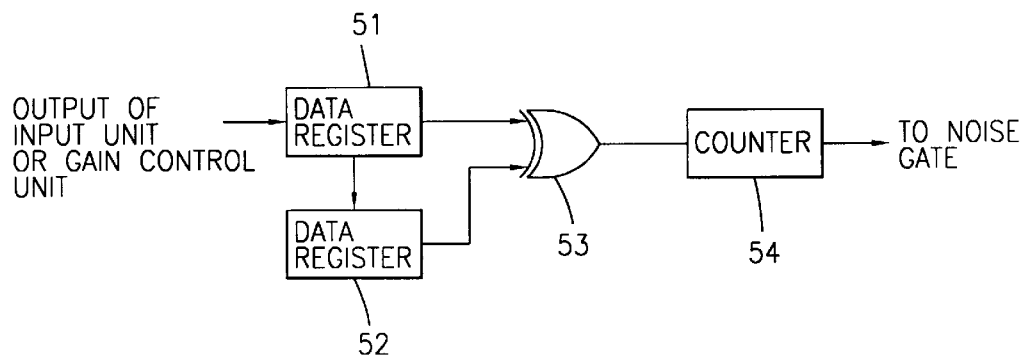
FIG. 5 is a block diagram showing first and second comparators in FIG. 4.

As shown in FIG. 5, each of the first and second comparators 50 and 60 include a data register 51 that stores a converted input value (i.e., the present data) from the input unit 10 and a data register 52 that stores a previous input value (i.e., the previous data) of the input unit 10. The data register 52 preferably receives the previous input value of the input unit 10 from the data register 51. Each of the first and second comparators 50 and 60 further include an exclusive OR gate 53 to exclusively OR the data stored in the data registers 51 and 52 and a counter 54 for increasing or resetting an output signal of the XOR gate 53.

Figure 6:
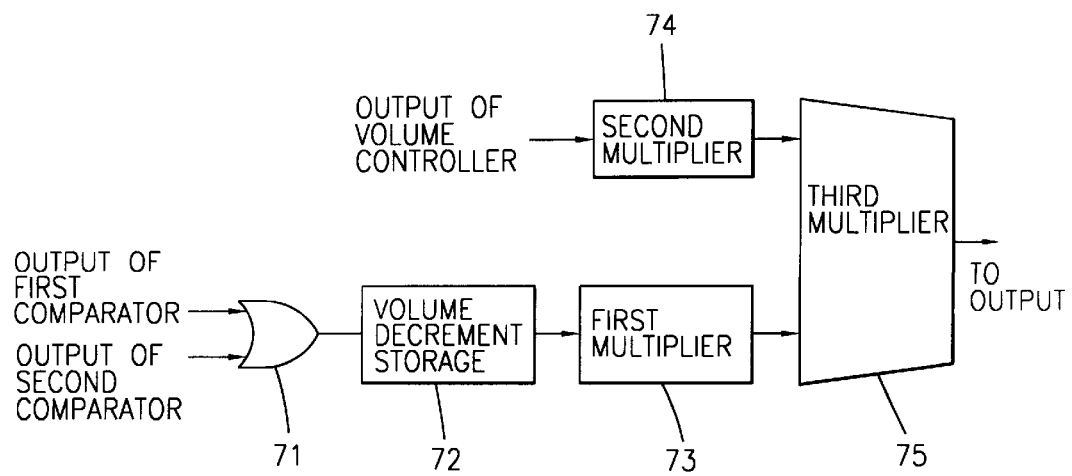
FIG. 6 is a block diagram showing a noise gate in FIG. 4.

As shown in FIG. 6, the noise gate 70 includes an OR gate 71 for ORing outputs of the first and second comparators 50, 60, and a volume decrement storage unit 72 for decreasing the volume to a floor value or second prescribed value based on an output value of the OR gate 71. A first multiplier 73 receives an output of the volume decrease store unit 72, a second multiplier 74 receives an output value of the volume controller 40, and a third multiplier 75 receives and multiplies an output value of the first and second multipliers 73, 74.

Operations of the noise gate apparatus for the preferred embodiment of the digital audio processor will now be described. First, the comparator 50 checks whether there is an externally applied signal. At the first comparator 50, no input signal variation denotes no external input signal or an applied DC component is received. However, the applied DC component preferably serves as an inaudible electrical signal that also denotes no signal input.

As a result of an inspection, if there is no external input, the counter 54 of the first comparator 50 buffers or counts input frequencies for a predetermined time before decreasing the output. Based on such buffering, a present output signal is prevented from decreasing by a sudden level difference despite the input value from the input unit 10 or lack thereof. The first comparator outputs a one bit control signal. The predetermined time (i.e., buffering) is determined by the number of bits of the counter 54.

The second comparator 60 receives a normal signal (the input signal) through the input unit 10 multiplied by a small value in the gain controller 20 to detect whether the multiplied value is a data processed in the signal processor 30. The other operations are identical to those of the first comparator 50.

The noise gate 70 controls gain of the final output. The noise gate 70 can decrease the volume value for a preset time so that the gain can be maintained or controlled low based on the output of the first and second comparators 50, 60.

As described above, the preferred embodiment of the digital audio processor has various advantages. The noise gate apparatus for a digital audio processor prevents noise. The noise gate apparatus of the digital audio processor blocks an external output of noise when there is no external signal input or when the internally processed data is lower than a high level.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An audio processor, comprising:
   a gain controller that receives an input signal, wherein the gain controller multiplies the input signal by a first predetermined value to control a size of the input signal;
   a signal processor that process a signal output by the gain controller and outputs a processed signal;
   a volume controller that multiplies the processed output signal of the signal processor by a second predetermined value to control a size of an output signal;
   a first comparator that compares the input signal and a previous input signal respectively received by the gain controller;
   a second comparator that compares the output signal and a previous output signal respectively output by the gain controller; and
   a noise gate that receives output signals from the first comparator and the second comparator, wherein the noise gate reduces a signal size of the output signal of the volume controller to a prescribed level based on the output signals of the first and second comparators.

2. The audio processor of claim 1, further comprising:
   an input unit that converts the input signal to a digital audio processor type for transmission to the first comparator and the gain controller; and
   an output unit that converts an output value of the noise gate to an external output data type.

3. The audio processor of claim 1, wherein the noise gate reduces the output signal size to the prescribed level when the input signal is smaller that the previous input signal.

4. The audio processor of claim 1, wherein each of the first and second comparators comprise:
   a first data register that stores and outputs a present data value;
   a second data register that stores and outputs a previous data value;
   a logic-gate that logically processes the data values output by the first and second data registers; and
   a counter that increases or resets an output signal of the logic-gate.

5. The audio processor of claim 4, wherein the logic-gate is an exclusive OR gate and the second data register receives the present data value from the first data register.

6. The audio processor of claim 1, wherein the noise gate comprises:
   a logic-gate that logically processes the output of the first and second comparators;
   a volume reduce store unit that reduces the volume to a first value based on an output value of the logic-gate;
   a first multiplier that receives an output of the volume reduce store unit;
   a second multiplier receives an output value of the volume controller; and
   a third multiplier that multiplies an output value of the first and second multipliers.

7. The apparatus of claim 6, wherein the logic-gate is an OR gate.

8. An apparatus, comprising:
   a gain controller that receives an input signal;
   a signal processor coupled to said gain controller;
   a volume controller coupled to the signal processor; and
   a noise gate apparatus coupled to the gain controller and the volume controller, said noise gate apparatus changing an output signal of said volume controller based on at least one of input and output signals of gain controller.

9. The apparatus of claim 8, wherein said noise gate apparatus comprises:
  a first comparator that compares the input signal and a previous input signal respectively received by the gain controller;
  a second comparator that compares the output signal and a previous output signal respectively output by the gain controller; and
  a noise gate that receives output signals from the first comparator and the second comparator, wherein the noise gate reduces a signal size of the output signal of the volume controller to a prescribed level based on the output signals of the first and second comparators.

10. The apparatus of claim 8, wherein said noise gate apparatus comprises:
  first means for comparing the input signal and a previous input signal respectively received by the gain controller;
  second means for comparing the output signal and a previous output signal respectively output by the gain controller; and
  noise gate means for receiving output signals from the first and second means, wherein the noise gate means reduces a signal size of the output signal of the volume controller to a prescribed level based on the output signals of the first and second means.

11. The apparatus of claim 8, further comprising:
  an input unit that converts the input signal to an audio processor type for transmission to the noise gate apparatus and the gain controller; and
  an output unit that converts an output value of the noise gate apparatus to an external output data type.

12. The apparatus of claim 8, wherein the noise gate apparatus reduces the output signal size to the prescribed level when the input signal is smaller that the previous input signal.

13. The apparatus of claim 9, wherein each of the first and second comparators comprises:
  a first data register that stores and outputs a present data value;
  a second data register that stores and outputs a previous data value;
  a logic-gate that logically processes the data values output by the first and second data registers; and
  a counter that increases or resets an output signal of the logic-gate.

14. The apparatus of claim 9, wherein the noise gate comprises:
  a logic-gate that logically processes the output of the first and second comparators;
  a volume reduce store unit that reduces the volume to a first value based on an output value of the logic-gate;
  a first multiplier that receives an output of the volume reduce store unit;
  a second multiplier receives an output value of the volume controller; and
  a third multiplier that multiplies an output value of the first and second multipliers.

15. A noise gate apparatus for an audio processor, comprising:
  a comparator unit that compares a present data value with a previous data value; and
  a noise gate receiving a comparison result from said comparator unit, said noise gate changing an output signal of the audio processor based on the comparison result.

16. The noise gate apparatus of claim 15, wherein said comparator unit comprises:
  a first comparator that compares an input signal and a previous input signal of the audio processor; and
  a second comparator that compares an output signal and a previous output signal of the audio processor, wherein said noise gate that receives output signals from the first comparator and the second comparator, wherein the noise gate reduces a signal size of the output signal of the volume controller to a prescribed level based on the output signals of the first and second comparators.

17. The noise gate apparatus of claim 16, wherein each of the first and second comparators comprise:
  a first data register that stores and outputs a present data value;
  a second data register that stores and outputs a previous data value;
  a logic-gate that logically processes the data values output by the first and second data registers; and
  a counter that increases or resets an output signal of the logic-gate.

18. The noise gate apparatus of claim 16, wherein the noise gate comprises:
  a logic-gate that logically processes the output of the first and second comparators;
  a volume reduce store unit that reduces the volume to a first value based on an output value of the logic-gate;
  a first multiplier that receives an output of the volume reduce store unit;
  a second multiplier receives an output value of the volume controller; and
  a third multiplier that multiplies an output value of the first and second multipliers.

* * * * *